(12) United States Patent
Mizutani

(10) Patent No.: US 10,133,185 B2
(45) Date of Patent: Nov. 20, 2018

(54) ILLUMINATION OPTICAL APPARATUS AND DEVICE MANUFACTURING METHOD

(71) Applicant: CANON KABUSHIKI KAISHA, Tokyo (JP)

(72) Inventor: Masaki Mizutani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/938,013

(22) Filed: Nov. 11, 2015

(65) Prior Publication Data

US 2016/0147162 A1    May 26, 2016

(30) Foreign Application Priority Data

Nov. 21, 2014 (JP) .................................. 2014-236356

(51) Int. Cl.
*G06F 7/20* (2006.01)
*G03F 7/20* (2006.01)

(52) U.S. Cl.
CPC ...... *G03F 7/70141* (2013.01); *G03F 7/70075* (2013.01); *G03F 7/7085* (2013.01); *G03F 7/70191* (2013.01)

(58) Field of Classification Search
CPC ............. G03F 7/70075; G03F 7/70141; G03F 7/70191; G03F 7/7085
See application file for complete search history.

(56) References Cited

U.S. PATENT DOCUMENTS

| | | |
|---|---|---|
| 5,557,692 A | 9/1996 | Pan et al. |
| 6,608,665 B1 | 8/2003 | Nishi et al. |
| 6,614,597 B2 | 9/2003 | Mizouchi |
| 7,580,116 B2 | 8/2009 | Maeda |
| 7,671,967 B2 | 3/2010 | Miyaharu et al. |
| 8,891,062 B2 | 11/2014 | Tsuji |

(Continued)

FOREIGN PATENT DOCUMENTS

| | | |
|---|---|---|
| EP | 0633506 A1 | 1/1995 |
| EP | 1118910 A2 | 7/2001 |

(Continued)

OTHER PUBLICATIONS

Office Action issued in Taiwanese Application No. TW104136163, dated Aug. 29, 2016. English translation provided.

(Continued)

*Primary Examiner* — Michelle M Iacoletti
(74) *Attorney, Agent, or Firm* — Rossi, Kimms & McDowell LLP

(57) ABSTRACT

Provided is an illumination optical apparatus for illuminating a mask with light from a light source. The apparatus includes an optical integrator configured to cause a light intensity distribution to be uniform in an emission end surface by reflecting the light incident from an incident end surface in an inner surface a plurality of times, an image forming optical system configured to form an image of the emission end surface of the optical integrator on the mask, and an adjustment unit configured to adjust telecentricity of the light so that a principal ray incident on the mask and a normal line of the mask approach parallelism and configured to be disposed outside the image forming optical system.

14 Claims, 5 Drawing Sheets

(56) References Cited

U.S. PATENT DOCUMENTS

| | | | |
|---|---|---|---|
| 2002/0067550 A1* | 6/2002 | Mizouchi | G02B 13/22 |
| | | | 359/663 |
| 2003/0227607 A1* | 12/2003 | Kato | G03F 7/70058 |
| | | | 355/53 |
| 2008/0111983 A1 | 5/2008 | Singer et al. | |
| 2009/0115990 A1* | 5/2009 | Owa | G02B 26/0833 |
| | | | 355/71 |

FOREIGN PATENT DOCUMENTS

| | | |
|---|---|---|
| EP | 1715385 A2 | 10/2006 |
| JP | 2001155993 A | 6/2001 |
| JP | 2002015987 A | 1/2002 |
| JP | 2002050564 A | 2/2002 |
| JP | 2003121764 A | 4/2003 |
| JP | 2003203853 A | 7/2003 |
| JP | 2004253758 A | 9/2004 |
| JP | 2005309313 A | 11/2005 |
| JP | 2012142460 A | 7/2012 |
| JP | 5036429 B2 | 9/2012 |
| KR | 1020030080181 A | 10/2003 |
| KR | 1020120079011 A | 7/2012 |
| WO | 2006074812 A2 | 7/2006 |

OTHER PUBLICATIONS

Office Action issued in Chinese Patent Application No. 201510786814.7 dated Apr. 27, 2017. English translation provided.
Office Action issued in Japanese Appln. No. 2014-236356 dated Aug. 21, 2018. English translation provided.
Office Action issued in Korean Appln. No. 10-2015-0154865 dated Aug. 14, 2018. English translation provided.

* cited by examiner

ILLUMINATION OPTICAL APPARATUS AND DEVICE MANUFACTURING METHOD

BACKGROUND OF THE INVENTION

Field of the Invention

The present invention relates to an illumination optical apparatus and a device manufacturing method.

Description of the Related Art

An exposure apparatus for use in manufacturing of a semiconductor device or the like transfers a pattern formed on an original plate (a reticle, a mask or the like) to a substrate (a wafer or the like on a surface of which a resist layer is formed) via an image forming optical system, a projection optical system, or the like. The exposure apparatus includes an illumination optical apparatus for illuminating the original plate with an optical flux from a light source. When the illumination light for the original plate of the illumination optical apparatus is not uniform or the telecentricity (a degree of parallelism between an optical axis and a main light beam) collapses, the pattern transfer to the substrate is insufficient and it is difficult for the exposure apparatus to provide a high-quality device. If the telecentricity collapses, a position at which an image is formed on the original plate is laterally shifted when the original plate is exposed at a position shifted with respect to the optical axis. When the telecentricity differs according to an image height, a distorted image is formed in the original plate. In any case, it is difficult to faithfully transfer a pattern of the original plate to the substrate. Therefore, improvement of luminance uniformity and adjustment of telecentricity are necessary in the illumination optical apparatus.

As a method of improving luminance uniformity, an illumination optical apparatus having an optical integrator is known. An inner surface reflection type optical integrator causes a light intensity distribution to be uniform in an emission end surface by reflecting an optical flux incident from an incident end surface in an inner surface a plurality of times. Further, it is possible to improve luminance uniformity in a surface to be illuminated by disposing an image forming optical system between the emission end surface and the surface to be illuminated so that the emission end surface and the surface have a conjugate relation.

On the other hand, a method of adjusting the telecentricity is disclosed in Japanese Patent Laid-Open No. 2002-50564. In an illumination optical apparatus disclosed in Japanese Patent Laid-Open No. 2002-50564, an emission end surface of an inner surface reflection type optical integrator and an incident end surface of a wave front division type optical integrator are connected to have a conjugate relation according to an image forming optical system. The telecentricity is adjusted by causing the inner surface reflection type optical integrator to have parallel eccentricity and changing a luminance distribution in an incident end surface of the wave front division type optical integrator. In addition, in the image forming optical system disclosed in Japanese Patent No. 5036429, the telecentricity is adjusted by changing the luminance distribution in a pupil surface using a method of shifting an optical beam transmitted through a pupil surface within the image forming optical system, a method of limiting a transmission region by shielding a part within an effective system of the pupil surface, or the like.

However, in the illumination optical apparatus disclosed in Japanese Patent Laid-Open No. 2002-50564, it is also necessary to provide the wave front division type optical integrator and the size and cost of the illumination optical apparatus increase. In addition, because it is necessary to form a good pupil surface within the image forming optical system in the image forming optical system disclosed in Japanese Patent No. 5036429, the image forming optical system is complex and the size and cost of the illumination optical apparatus increase.

SUMMARY OF THE INVENTION

The present invention provides an illumination optical apparatus capable of avoiding an increase in size and an increase in cost in association with an increase in the number of optical components and complexity of an image forming optical system, improving luminance uniformity of illumination light, and adjusting telecentricity.

In order to solve the above-described problems, the present invention provides an illumination optical apparatus for illuminating a mask with light from a light source, the apparatus including: an optical integrator configured to cause alight intensity distribution to be uniform in an emission end surface by reflecting the light incident from an incident end surface in an inner surface a plurality of times; an image forming optical system configured to form an image of the emission end surface of the optical integrator on the mask; and an adjustment unit configured to adjust telecentricity of the light so that a principal ray incident on the mask and a normal line of the mask approach parallelism and configured to be disposed outside the image forming optical system.

Further features of the present invention will become apparent from the following description of exemplary embodiments with reference to the attached drawings.

DESCRIPTION OF THE EMBODIMENTS

Hereinafter, embodiments of the present invention will be described with reference to the drawings.

Figure 1:
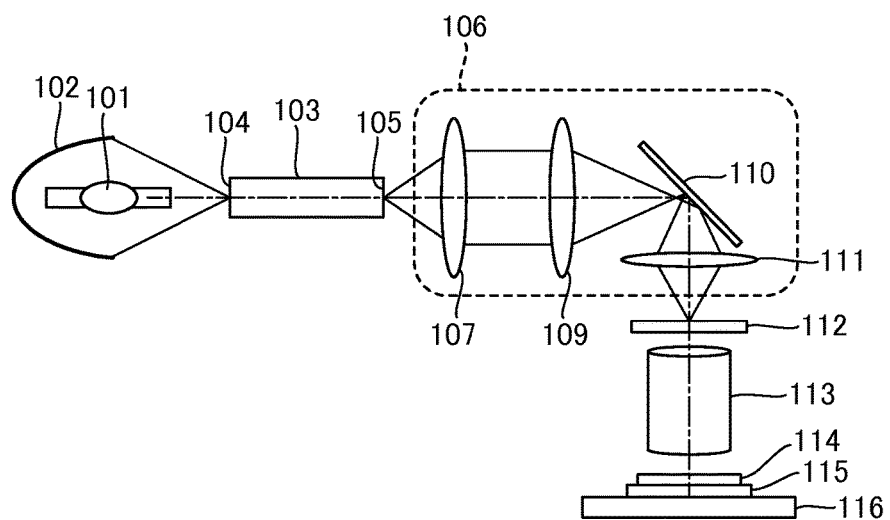
FIG. 1 is a diagram illustrating a schematic diagram of an exposure apparatus.

As illustrated in FIG. 1, an exposure apparatus includes a light source 101, an elliptical mirror 102, an optical integrator 103, and an image forming optical system 106. The light source 101 is constituted of an extra-high-pressure mercury lamp or the like, and disposed in the vicinity of a first focus of the elliptical mirror 102. The elliptical mirror 102 condenses an optical flux from the light source 101 into an incident end surface 104 of an optical integrator 103.

The optical integrator 103 is an inner surface reflection type optical member configured to cause a light intensity distribution to be uniform in an emission end surface 105 by reflecting an optical flux incident from an incident end surface 104 in an inner surface a plurality of times. As the optical integrator 103, an optical rod is used in an embodiment of the present invention. The incident end surface 104 of the optical integrator 103 is disposed in the vicinity of a second focus of the elliptical mirror 102.

The image forming optical system 106 includes a first optical member 107, a second optical member 109, a reflection mirror 110, and a condenser lens 111. Also, an optically conjugate pupil surface for the optical integrator emission end surface 105 is formed between the first optical member 107 and the second optical member 109. In addition, the optical integrator emission end surface 105 and a surface 112 to be illuminated such as an original plate (mask) are designed to have an optically conjugate relation, so that it is possible to illuminate the surface 112 to be illuminated at uniform luminance.

Light radiated to the surface 112 to be illuminated is projected and exposed on a substrate 114 held in a substrate holding chuck 115 on a substrate stage 116 for positioning the substrate through a projection optical system 113, and a pattern of the surface 112 to be illuminated is transferred.

Figure 2:
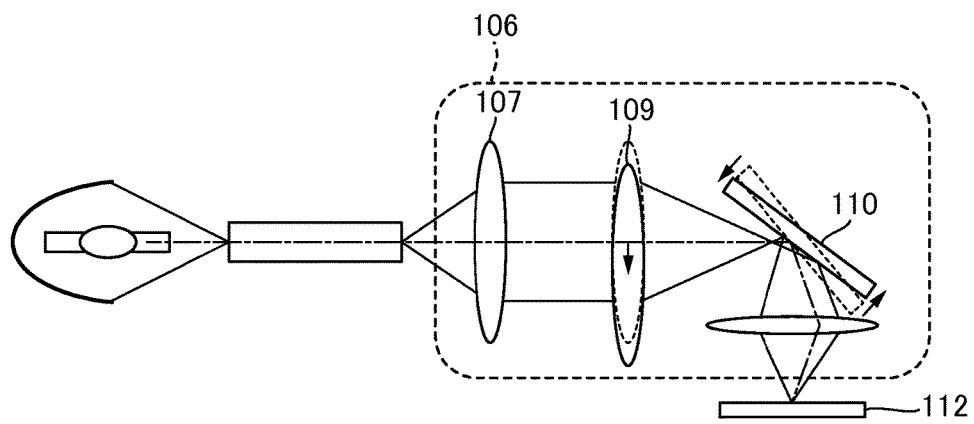
FIG. 2 is a diagram illustrating a state in which telecentricity of illumination light is shifted.

Next, causes of collapse of telecentricity of light for illuminating the surface 112 to be illuminated will be described using FIG. 2.

An example is the case in which the second optical member 109 within the image forming optical system 106 is eccentric due to an assembly error or the like. In this case, a main light beam emitted from the image forming optical system 106 is tilted with respect to an optical axis (is not parallel to a normal line of the surface 112 to be illuminated) and the telecentricity of the illumination light collapses.

Another example is the case in which the reflection mirror 110 within the image forming optical system 106 is eccentric due to an assembly error or the like. When an installation angle of the reflection mirror 110 is shifted from a design value, an angle of the entire optical flux after the reflection is shifted from an ideal angle and the telecentricity of the illumination light collapse.

Still another example is the case in which there is non-uniformity of reflectance in a reflection film applied to a surface of the reflection mirror 110 or there is non-uniformity of the reflectance due to a difference of an angle of incidence of an optical flux, or the like. Even in this case, the optical flux emitted from the image forming optical system 106 is bad in terms of symmetry of light intensity, the main light beam of the illumination light is not parallel to the normal line of the surface 112 to be illuminated, and the telecentricity collapses.

Figure 4A:
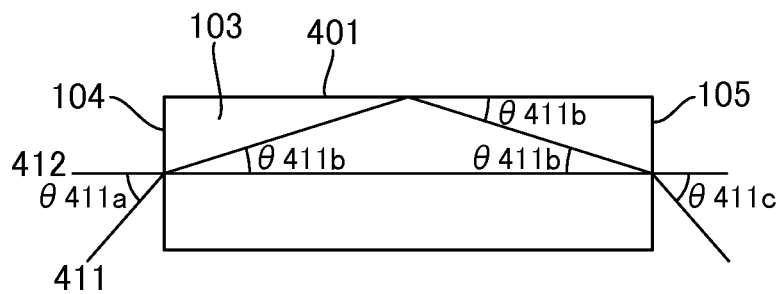
FIG. 4A is a diagram illustrating the behavior of a light beam within an inner surface reflection type optical integrator.

The behavior of a light beam within the optical integrator 103 will be described. FIG. 4A is a diagram illustrating the behavior of a light beam when the optical integrator 103 is not tilted. Among light beams incident on the incident end surface 104, a light beam incident at an angle from a lower direction on the page is denoted by reference sign 411 and a main light beam is denoted by reference sign 412. An angle formed between the main light beam 412 and the light beam 411 is designated as θ411a. An angle after incidence on the incident end surface 104 of the light beam 411 is designated as θ411b and the reflectance of the optical integrator 103 is denoted by n. Then, in terms of the angle θ411b after the incidence in the incident end surface 104, a relation of Sin(θ411a)=n×Sin(θ411b) is established according to Snell's law.

A light beam incident on the incident end surface 104 at a refraction angle of θ411b is totally reflected by a wall surface 401 of a longitudinal direction of the optical integrator 103. Thus, a reflection angle of light reflected by the wall surface 401 is also held at θ411b. When an angle formed by a light beam after emission in the emission end surface 105 and a main light beam is designated as θ411c, the relation of n×Sin (θ411b)=Sin (θ411c) is established according to Snell's law. That is, it can be seen that θ411a=θ411c and the angles of light before and after incidence on the optical integrator 103 are preserved.

Figure 4B:
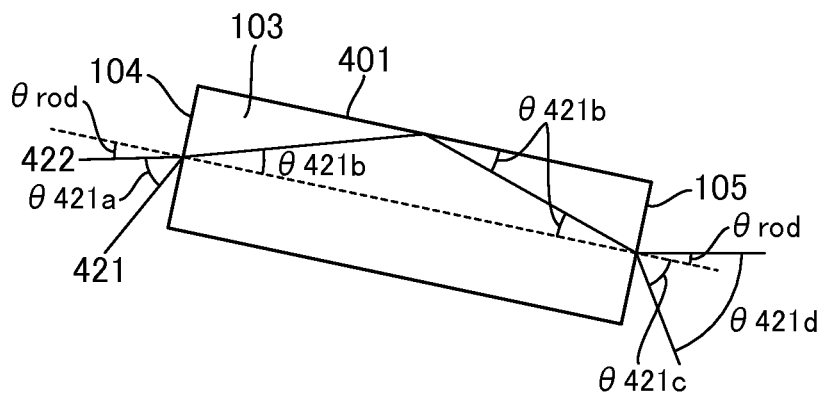
FIG. 4B is a diagram illustrating the behavior of a light beam when the optical integrator of FIG. 4A is tilted.

Next, the case in which the optical integrator 103 is tilted with respect to an optical axis is considered. FIG. 4B is a diagram illustrating the case in which the number of reflections of a light beam is 1 in a state in which the axis of the longitudinal direction of the optical integrator 103 is tilted at θrod with respect to the optical axis.

Among light beams incident on the incident end surface 104, a light beam incident at an angle from the lower direction on the page is denoted by reference sign 421 and a main light beam is denoted by reference sign 422. An angle formed between the main light beam 422 and the light beam 421 is designated as θ421a. An incident angle in the incident end surface 104 of the light beam 421 becomes (θ421a+θrod) because the optical integrator 103 is tilted at θrod with respect to the main light beam 422. When the angle after the incidence in the incident end surface 104 of the light beam 421 is θ421b and the reflectance of the optical integrator 103 is denoted by n, a relation of Sin(θ421a+θrod)=n×Sin (θ421b) is established according to Snell's law.

The light beam incident on the optical integrator 103 at a refraction angle of θ421b is totally reflected by the wall surface 401 of the longitudinal direction of the optical integrator 103. Thus, a reflection angle of light reflected by the wall surface 401 is also held at θ421b. When an emission angle in the emission end surface 105 is designated as θ421c, the relation of n×Sin(θ421b)=Sin(θ421c) is established according to Snell's law but the angle of θ421d for the optical axis becomes θ421d=θ421c+θrod. That is, a relation of θ421d=θ421a+2θrod is established from a relation of Sin (θ421a+θrod)=Sin(θ421c)=Sin(θ421d−θrod). Accordingly, it can be seen that a light beam angle after emission in the emission end surface 105 changes to an angle obtained by adding an amount twice a tilt amount of the optical integrator 103 to a light beam angle before incidence in the incident end surface 104.

Figure 4C:
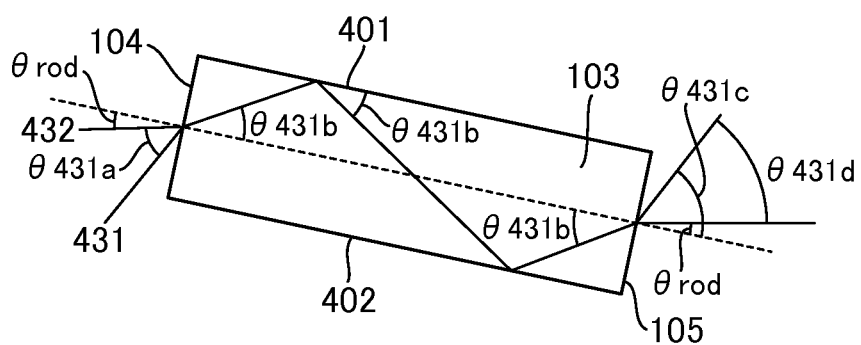
FIG. 4C is a diagram illustrating the behavior of a light beam when the optical integrator of FIG. 4A is tilted.

Next, the case in which the axis of the longitudinal direction of the optical integrator 103 is tilted at θrod with respect to the optical axis and the number of reflections of the light beam is 2 will be described using FIG. 4C.

Among light beams incident on the incident end surface 104, a light beam incident at an angle from the lower direction on the page is denoted by reference sign 431 and a main light beam is denoted by reference sign 432. An angle formed between the main light beam and the light beam 431 is designated as θ431a. An angle of incidence on the incident end surface 104 of the light beam 431 becomes (θ431a+θrod) because the optical integrator 103 is tilted at θrod with respect to the main light beam 432. Consequently, when the angle after the incidence in the incident end surface 104 of the light beam 431 is θ431b and the reflectance of the optical integrator 103 is denoted by n, a relation of Sin(θ431a+θrod)=n×Sin(θ431b) is established according to Snell's law.

The light beam incident on the optical integrator 103 at a refraction angle of θ431b is totally reflected by the wall surface 401 of the longitudinal direction of the optical integrator 103. Thus, a reflection angle of light reflected by the wall surface 401 is also held at θ431b. The light beam reflected by the wall surface 401 is totally reflected by a lower wall surface 402 of the longitudinal direction of the optical integrator 103 again. Even at this time, the reflection angle of the light reflected by the lower wall surface 402 is held at θ431b. In terms of the emission angle in the emission end surface 105, a relation of n×Sin(θ431b)=Sin(θ431c) is established according to Snell's law. The angle θ431d for the optical axis becomes θ431d=θ431c−θrod.

That is, a relation of θ431d=θ431a is established from a relation of Sin (θ431a+θrod)=Sin(θ431c)=Sin(θ431d+θrod). Accordingly, it can be seen that alight beam angle after emission in the emission end surface 105 is the same as a light beam angle before incidence in the incident end surface 104.

In this manner, the light beam angles before and after incidence of the optical integrator 103 tilted at θrod with respect to the optical axis differ according to the number of reflections within the optical integrator 103. The light beam angle after the emission becomes an angle obtained by adding 2θrod to an angle at the time of incidence in the case of one reflection and the light beam angle after the emission is the same as the angle at the time of incidence in the case of two reflections.

In addition, this phenomenon includes the case in which the light beam angle after the emission is described as an angle obtained by adding 2θrod to the angle at the time of incidence when the number of reflections is an odd number and the light beam angle after the emission is described to be the same as the angle at the time of incidence when the number of reflections is an even number.

In general, the number of inner surface reflections sufficiently increases to form a uniform light intensity distribution of the surface 112 to be illuminated. Therefore, the optical flux of emission of the optical integrator 103 can change the center of gravity at an average of θrod by tilting the optical integrator 103 θrod and the telecentricity of light for illuminating the surface 112 to be illuminated can be adjusted.

First Embodiment

Figure 3:
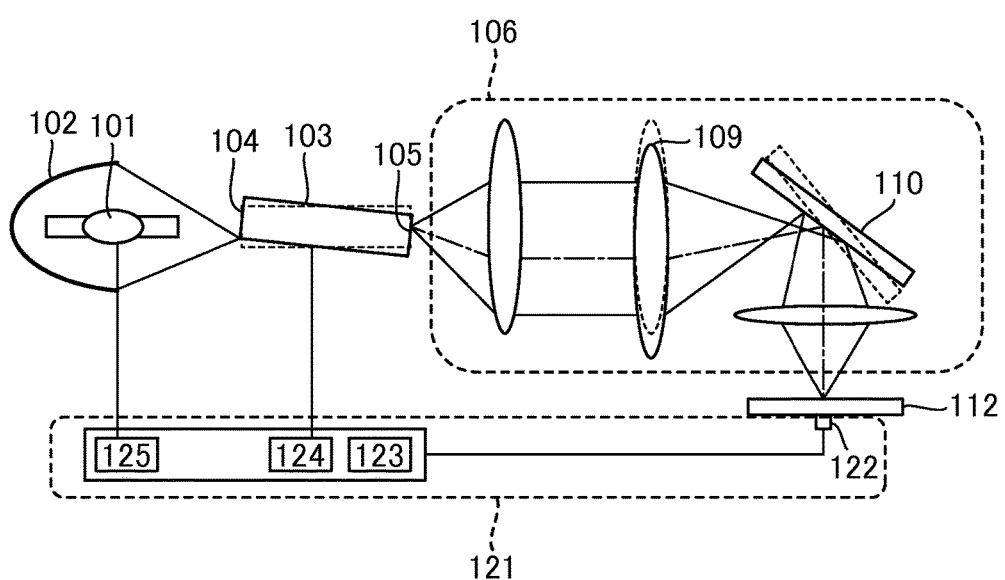
FIG. 3 is a diagram illustrating a method of adjusting telecentricity of illumination light according to a first embodiment.

FIG. 3 is a diagram illustrating an illumination optical apparatus according to the first embodiment of the present invention. Here, for example, a state in which a second optical member 109 and a reflection mirror 110 of an image forming optical system 106 are eccentric is illustrated as in FIG. 2.

In this embodiment, a telecentricity adjustment unit 121 is provided outside an image forming optical system 106. The adjustment unit 121 includes a measurement unit 122 configured to measure telecentricity and a calculation processing unit 123 configured to calculate a telecentricity value from a measured value. Further, there are provided an optical component driving mechanism (driving mechanism) 124 configured to drive the optical integrator 103 based on a calculation processing result and a light source driving mechanism 125 configured to move a position of a light source 101 according to a center position change amount of an incident end surface 104. It is not always necessary to provide the measurement unit 122 on a surface 112 to be illuminated. The measurement unit 122 may be provided on a substrate stage 116 or at another position at which measurement is possible.

The telecentricity adjustment unit 121 adjusts the telecentricity by tilting the optical integrator 103 according to the optical component driving mechanism (driving mechanism) 124 based on the calculation processing result by the calculation processing unit 123.

Because the emission end surface 105 and the surface 112 to be illuminated have an optically conjugate relation, a radiation region in the surface 112 to be illuminated changes when the center position of the emission end surface 105 is shifted and no light is radiated to a desired region of the surface 112 to be illuminated. Therefore, it is desirable to tilt the optical integrator 103 with the center position of the emission end surface 105 designated as a rotation center so that the center position of the emission end surface 105 does not change when the optical integrator 103 is tilted.

In addition, when the optical integrator 103 is tilted with the emission end surface 105 designated as the rotation center as described above, the center position of the incident end surface 104 changes. Because the incident end surface 104 is disposed in the vicinity of a second focus of an elliptical mirror 102 for use in a condensing unit of alight source 101 as described above, an intensity of light incident on the optical integrator 103 is reduced when the center position of the incident end surface 104 changes.

In order to prevent this from being a concern, a positional relation of the light source 101 in which luminance is maximized with respect to the center position of the incident end surface 104 is obtained in advance. Then, it is possible to avoid the degradation of luminance by moving the position of the light source 101 using the light source driving mechanism 125 according to a change amount of the center position of the incident end surface 104 when the optical integrator 103 is tilted.

In this manner, the illumination optical apparatus illustrated in FIG. 3 can achieve both uniformity of a light intensity distribution in a surface to be illuminated such as an original plate and adjustment of telecentricity without increasing the number of optical components and complicating an image forming optical system.

As described above, according to this embodiment, it is possible to provide an illumination optical apparatus capable of avoiding an increase in a size and cost of the illumination optical apparatus, improving luminance uniformity of illumination light in a surface to be illuminated, and adjusting telecentricity.

Second Embodiment

Figure 5:
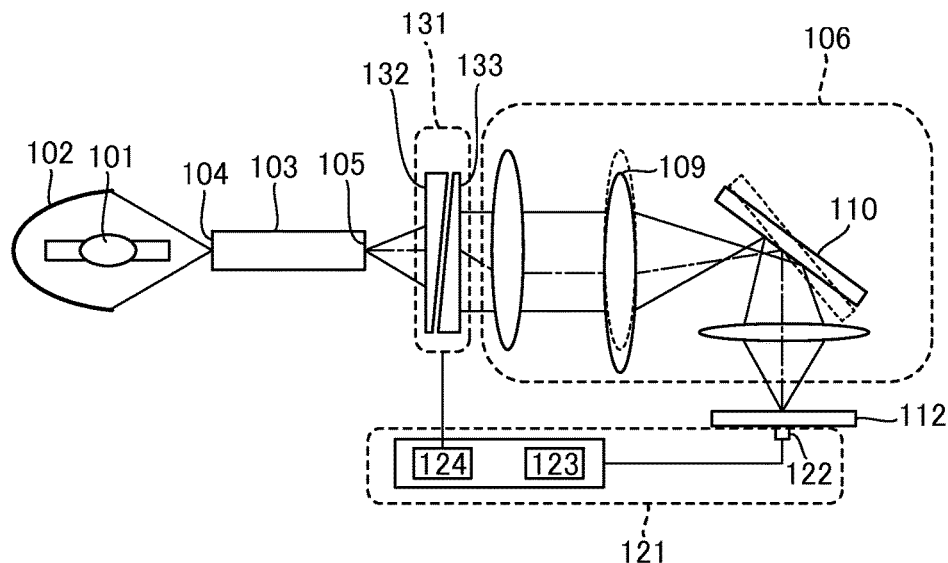
FIG. 5 is a diagram illustrating a method of adjusting telecentricity of illumination light according to a second embodiment.

Next, an illumination optical apparatus according to the second embodiment of the present invention will be described. A configuration of a processing apparatus according to this embodiment is similar to the first embodiment, but is different from the first embodiment in that no light source driving mechanism 125 is included in a telecentricity adjustment unit 121. In addition, a wedge-shaped optical element pair 131 is disposed between an optical rod 103 and an image forming optical system 106. FIG. 5 is a diagram illustrating a configuration of the illumination optical apparatus according to this embodiment.

Figure 6A:
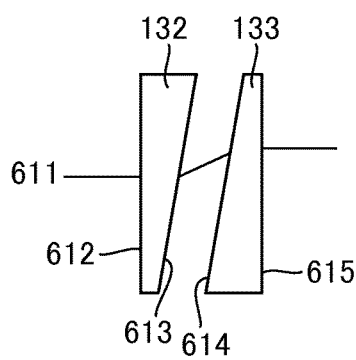
FIG. 6A is a diagram illustrating the behavior of a light beam passing through a wedge-shaped optical element pair.
Figure 6B:
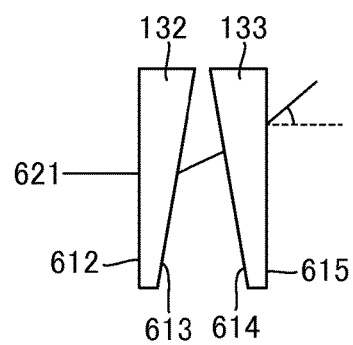
FIG. 6B is a diagram illustrating the behavior of a light beam when a rear-side wedge-shaped optical element of FIG. 6A rotates 180 degrees in a surface perpendicular to an optical axis about the optical axis.
Figure 6C:
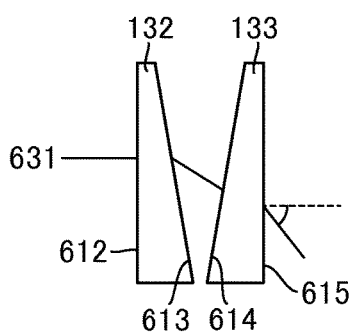
FIG. 6C is a diagram illustrating the behavior of a light beam when a front-side wedge-shaped optical element of FIG. 6B and the rear-side wedge-shaped optical element rotate 180 degrees in a surface perpendicular to the optical axis about the optical axis.

As illustrated in FIGS. 6A to 6C, the wedge-shaped optical element pair 131 includes a front-side wedge-shaped optical element 132 and a rear-side wedge-shaped optical element 133 having the same shape which face each other in parallel. A surface on which light of the front-side wedge-shaped optical element 132 is incident is perpendicular to an optical axis and a surface from which light of the rear-side wedge-shaped optical element 133 is emitted is perpendicular to the optical axis.

Here, the wedge shape used in this embodiment is a trapezoid instead of a V shape as illustrated in FIGS. 6A to 6C, and a leg of one side of the trapezoid is assumed to be perpendicular to a top base and a bottom base. In addition, it is assumed that the wedge shape may be a vertical triangle.

The behavior of a light beam passing through the wedge-shaped optical element pair 131 will be described. FIG. 6A is a diagram illustrating a state in which no angle change occurs when a light beam incident on the wedge-shaped optical element pair 131 is emitted. In this case, an incident light beam 611 is refracted according to Snell's law in a front-side wedge-shaped optical element emission end surface 613 and a rear-side wedge-shaped optical element incident end surface 614. In this case, tilt angles of the front-side wedge-shaped optical element emission end surface 613 and the rear-side wedge-shaped optical element incident end surface 614 with respect to an optical axis are equal. Consequently, an emission angle in a rear-side wedge-shaped optical element emission end surface 615 is parallel to the optical axis and light beam angles before and after the light beam passes through the wedge-shaped optical element pair 131 do not change.

FIG. 6B is a diagram illustrating a state in which an emission angle of a light beam incident on the wedge-shaped optical element pair 131 changes. This state is a state in which the rear-side wedge-shaped optical element 133 is rotated 180 degrees in a surface perpendicular to the optical axis about the optical axis from the state of FIG. 6A as illustrated in the diagram. In this case, the incident light beam 621 is refracted according to Snell's law in the front-side wedge-shaped optical element emission end surface 613 and the rear-side wedge-shaped optical element incident end surface 614. In this case, the tilt angles of the front-side wedge-shaped optical element emission end surface 613 and the rear-side wedge-shaped optical element incident end surface 614 are different with respect to the optical axis. Consequently, the emission angle in the rear-side wedge-shaped optical element emission end surface 615 is not parallel to the optical axis and light beam angles before and after the light beam passes through the wedge-shaped optical element pair 131 change.

FIG. 6C is a diagram illustrating a state in which an emission angle of a light beam incident on the wedge-shaped optical element pair 131 changes. This state is a state when optical elements of both the front-side wedge-shaped optical element 132 and the rear-side wedge-shaped optical element 133 are rotated 180 degrees in a surface perpendicular to the optical axis about the optical axis from the state of FIG. 6B as illustrated in the diagram. Because angles of the front-side wedge-shaped optical element emission end surface 613 and the rear-side wedge-shaped optical element incident end surface 614 are inverted with respect to the optical axis as compared with FIG. 6B, an angle from which the light beam is emitted from the rear-side wedge-shaped optical element emission end surface 615 also becomes an angle inverted with respect to the optical axis as compared with the case of FIG. 6B.

In this embodiment, an optical component driving mechanism (rotation mechanism) 124 is connected to the wedge-shaped optical element pair 131 outside the image forming optical system 106. The optical component driving mechanism (rotation mechanism) 124 rotates the front-side wedge-shaped optical element 132 and/or the rear-side wedge-shaped optical element 133 180 degrees in a plane (about the optical axis) perpendicular to the optical axis based on a calculation result of a calculation processing unit 123 and adjusts telecentricity. As in the first embodiment, it is not necessarily necessary to provide the measurement unit 122 on a surface 112 to be illuminated. The measurement unit 122 may be provided on a substrate stage 116 or at another position at which measurement is possible. Even in an illumination optical apparatus having this configuration, similar effects to the first embodiment are obtained.

Third Embodiment

Figure 7:
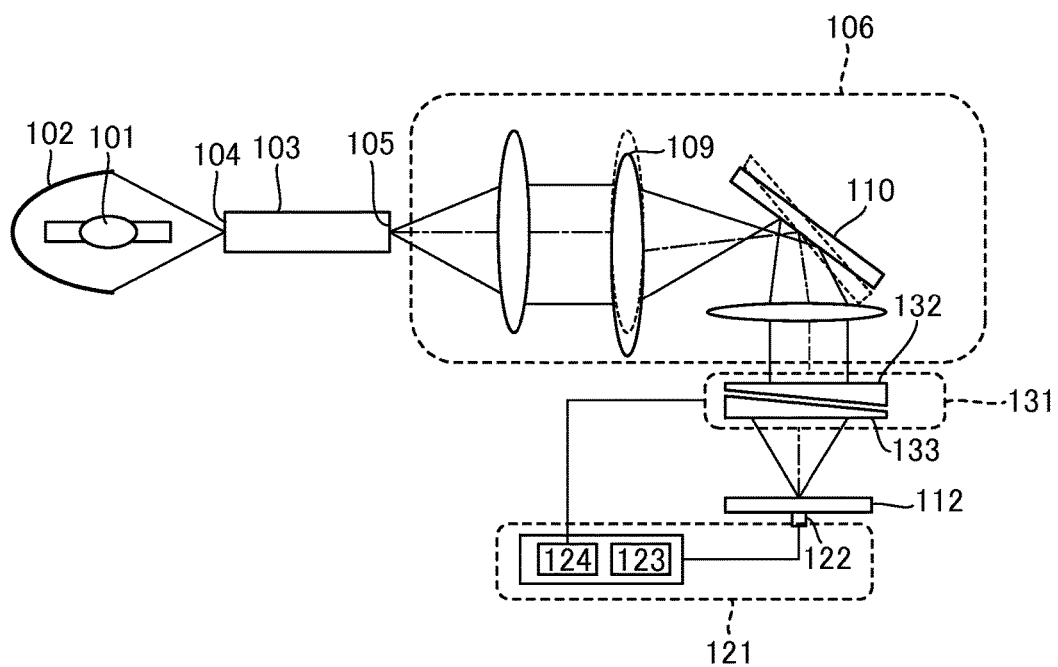
FIG. 7 is a diagram illustrating a method of adjusting telecentricity of illumination light according to a third embodiment.

Next, an illumination optical apparatus according to the third embodiment of the present invention will be described. A processing apparatus according to this embodiment is similar to that of the second embodiment, but is different from the second embodiment in that a wedge-shaped optical element pair 131 is disposed between an image forming optical system 106 and a surface 112 to be illuminated. FIG. 7 is a diagram illustrating the illumination optical apparatus according to this embodiment.

Even in this embodiment, as in the second embodiment, an optical component driving mechanism (rotation mechanism) 124 is connected to the wedge-shaped optical element pair 131 outside the image forming optical system 106. The optical component driving mechanism (rotation mechanism) 124 rotates the front-side wedge-shaped optical element 132 and/or the rear-side wedge-shaped optical element 133 180 degrees in a plane (about the optical axis) perpendicular to the optical axis based on a calculation result of a calculation processing unit 123 and adjusts telecentricity. As in the first and second embodiments, it is not necessarily necessary to provide the measurement unit 122 on a surface 112 to be illuminated and the measurement unit 122 may be provided on a substrate stage 116 or at another position at which measurement is possible. Even in an illumination optical apparatus having this configuration, similar effects to the first and second embodiments are obtained.

In the first to third embodiment, the optical component driving mechanism automatically tilts or rotates an optical component based on the calculation result of the calculation processing unit 123 to adjust telecentricity. However, the tilt or rotation may be manually performed.

(Device Manufacturing Method)

A device manufacturing method according to an embodiment of the present invention is preferred in manufacturing a device such as a micro device such as a semiconductor device or the like, an element or the like having a microstructure, or the like. The device manufacturing method may include a step of transferring an image of pattern formed on a mask to a photosensitive material coated on a substrate (e.g., exposure process) using the aforementioned illumination optical apparatus; and a step of developing the substrate on which a latent image pattern has been formed in the previous step. Furthermore, the device manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-236356 filed Nov. 21, 2014, which is hereby incorporated by reference herein in its entirety.

What is claimed is:

1. An illumination optical apparatus for illuminating a mask with light from a light source, the apparatus comprising:
   an optical integrator configured to reflect the light incident from an incident end plane in an inner surface a plurality of times;
   an image forming optical system configured to form an image of an emission end plane of the optical integrator on the mask, an illumination area of the mask corresponding to a position of the emission end plane of the optical integrator; and
   a tilting unit configured to tilt the optical integrator with a center position of the emission end plane of the optical integrator designated as a rotation center,
   wherein telecentricity of light incident on the mask changes according to the tilt of the optical integrator.

2. The illumination optical apparatus according to claim 1,
   wherein the adjustment unit includes
   a wedge-shaped optical element pair; and
   a mechanism configured to rotate at least one of the wedge-shaped optical element pair about an optical axis, and
   wherein the telecentricity of the light changes according to the rotation of the at least one of the wedge-shaped optical element pair about the optical axis.

3. The illumination optical apparatus according to claim 2, wherein the wedge-shaped optical element pair is disposed between the emission end plane of the optical integrator and the image forming optical system.

4. The illumination optical apparatus according to claim 2, wherein the wedge-shaped optical element pair is disposed between the image forming optical system and the mask.

5. The illumination optical apparatus according to claim 2,
   wherein the wedge-shaped optical element pair includes a first wedge-shaped optical element and a second wedge-shaped optical element,
   wherein a surface on which the light of the first wedge-shaped optical element is incident is perpendicular to the optical axis, and
   wherein a surface from which the light of the second wedge-shaped optical element is emitted is perpendicular to the optical axis.

6. The illumination optical apparatus according to claim 1, further comprising
   a measurement unit configured to measure the telecentricity,
   wherein the tilting unit adjusts the telecentricity based on the telecentricity measured by the measurement unit.

7. The illumination optical apparatus according to claim 6, wherein the adjustment unit includes a rotation mechanism configured to rotate the wedge-shaped optical element pair in a plane perpendicular to the optical axis based on a measured value by the measurement unit.

8. The illumination optical apparatus according to claim 1, wherein the tilting unit includes a driving mechanism configured to tilt the optical integrator at the center position of the emission end plane of the optical integrator as the rotation center.

9. The illumination optical apparatus according to claim 1, further comprising a light source driving mechanism configured to move a position of the light source according to a changing of the position of the incident end plane of the optical integrator.

10. The illumination optical apparatus according to claim 1, wherein a path of light from the emission end plane of the optical integrator to the mask is free of an optical integrator.

11. An exposure apparatus for transferring an image of a pattern formed on a mask to a substrate, the apparatus comprising:
    an illumination optical apparatus configured to illuminate the mask with light from a light source,
    wherein the illumination optical apparatus includes:
    an optical integrator configured to reflect the light incident from an incident end plane in an inner surface a plurality of times;
    an image forming optical system configured to form an image of an emission end plane of the optical integrator on the mask, an illumination area of the mask corresponding to a position of the emission end plane of the optical integrator; and
    a tilting unit configured to tilt the optical integrator with a center position of the emission end plane of the optical integrator designated as a rotation center,
    wherein telecentricity of light incident on the mask changes according to the tilt of the optical integrator.

12. A method of manufacturing a device, the method comprising steps of:
    exposing a substrate using an exposure apparatus for transferring an image of a pattern formed on a mask to a substrate;
    developing the substrate exposed in the exposing; and
    manufacturing the device from the developed substrate,
    wherein the exposure apparatus includes:
    an illumination optical apparatus,
    wherein the illumination optical apparatus is configured to illuminate the mask with light from a light source, and includes:
    an optical integrator configured to reflect the light incident from an incident end plane in an inner surface a plurality of times;
    an image forming optical system configured to form an image of an emission end plane of the optical integrator on the mask, an illumination area of the mask corresponding to a position of the emission end plane of the optical integrator; and
    a tilting unit configured to tilt the optical integrator with a center position of the emission end plane of the optical integrator designated as a rotation center,
    wherein telecentricity of light incident on the mask changes according to the tilt of the optical integrator.

13. An adjusting method for adjusting telecentricity of an illumination optical apparatus for illuminating a mask with light from a light source,
    wherein the illumination optical apparatus comprises an optical integrator configured to reflect the light incident from an incident end plane in an inner surface a plurality of times and an image forming optical system configured to form an image of an emission end plane of the optical integrator on the mask, an illumination area of the mask corresponding to a position of the emission end plane of the optical integrator, and wherein the method comprises adjusting telecentricity of light incident on the mask by tilting the optical integrator with a center position of the emission end plane of the optical integrator designated as a rotation center.

14. A manufacturing method for manufacturing an illumination optical apparatus for illuminating a mask with light from a light source, the method comprising:

assembling an optical integrator configured to reflect the light incident from an incident end plane in an inner surface a plurality of times and an image forming optical system configured to form an image of an emission end plane of the optical integrator on the mask in the illumination optical apparatus, an illumination area of the mask corresponding to a position of the emission end plane of the optical integrator; and adjusting telecentricity of light incident on the mask by tilting the optical integrator with a center position of the emission end plane of the optical integrator designated as a rotation center.

* * * * *